US012292368B2

(12) United States Patent
Yonekawa et al.

(10) Patent No.: US 12,292,368 B2
(45) Date of Patent: May 6, 2025

(54) EVALUATION METHOD, SUBSTRATE PROCESSING APPARATUS, MANUFACTURING METHOD OF SUBSTRATE PROCESSING APPARATUS AND ARTICLE MANUFACTURING METHOD

(71) Applicant: CANON KABUSHIKI KAISHA, Tokyo (JP)

(72) Inventors: Masami Yonekawa, Tochigi (JP); Hisanobu Azuma, Tochigi (JP); Toshihiro Ifuku, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 487 days.

(21) Appl. No.: 17/732,342

(22) Filed: Apr. 28, 2022

(65) Prior Publication Data

US 2022/0364972 A1    Nov. 17, 2022

(30) Foreign Application Priority Data

May 12, 2021  (JP) .................................. 2021-081199

(51) Int. Cl.
G01N 15/06      (2024.01)
G03F 7/00       (2006.01)
H01L 21/66      (2006.01)

(52) U.S. Cl.
CPC ..... G01N 15/0606 (2013.01); G03F 7/70608 (2013.01); H01L 22/10 (2013.01)

(58) Field of Classification Search
CPC .................................................. G01N 15/0606
USPC ...................................................... 73/514.25
See application file for complete search history.

(56) References Cited

U.S. PATENT DOCUMENTS 7,889,312 B2      2/2011 Franken et al.
2017/0246792 A1*  8/2017 Yonekawa ............ B29C 59/002
2018/0356741 A1* 12/2018 Matsuoka ........... G03F 7/70925

FOREIGN PATENT DOCUMENTS

JP      2000260671 A     9/2000
JP      2015126092 A     7/2015
TW       200823606 A     6/2008
(Continued)

OTHER PUBLICATIONS

Office Action issued in Taiwanese Appln. No. 111114987, dated Nov. 15, 2024. English translation provided.

*Primary Examiner* — Walter L Lindsay, Jr.
*Assistant Examiner* — Philip T Fadul
(74) *Attorney, Agent, or Firm* — ROSSI, KIMMS & McDOWELL LLP

(57) ABSTRACT

The present invention provides an evaluation method for evaluating a state in an apparatus concerning particles existing inside a substrate processing apparatus for processing a substrate, including arranging a plate in a charged state inside the apparatus and obtaining the number of particles adhered to the plate by performing a dummy operation different from an operation of processing the substrate, and evaluating the state in the apparatus based on a coefficient representing a ratio of the number of particles adhered to the plate by performing the dummy operation for the plate in an uncharged state to the number of particles adhered to the plate in the charged state, and the number of particles obtained in the arranging the plate.

14 Claims, 7 Drawing Sheets

(56) References Cited

FOREIGN PATENT DOCUMENTS

TW       201640230 A   11/2016
WO     2016142370 A1   9/2016

\* cited by examiner

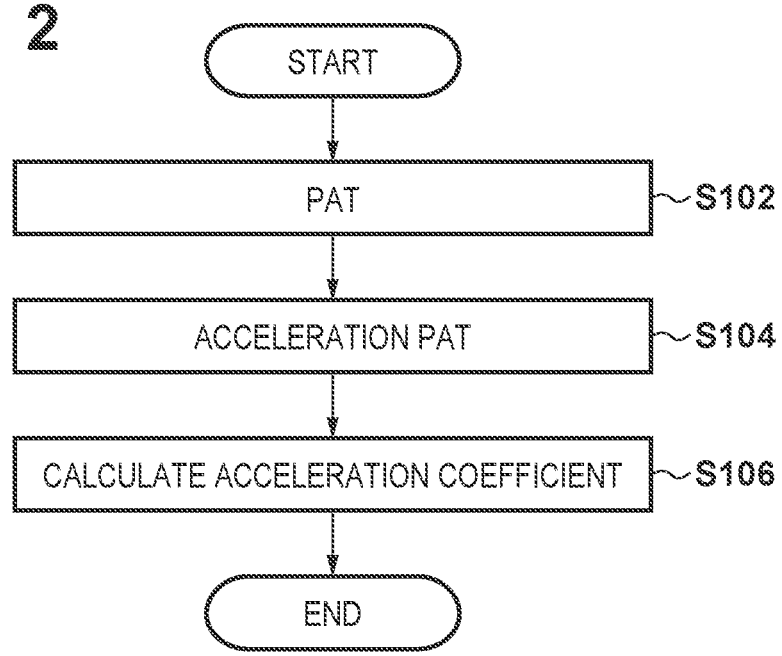
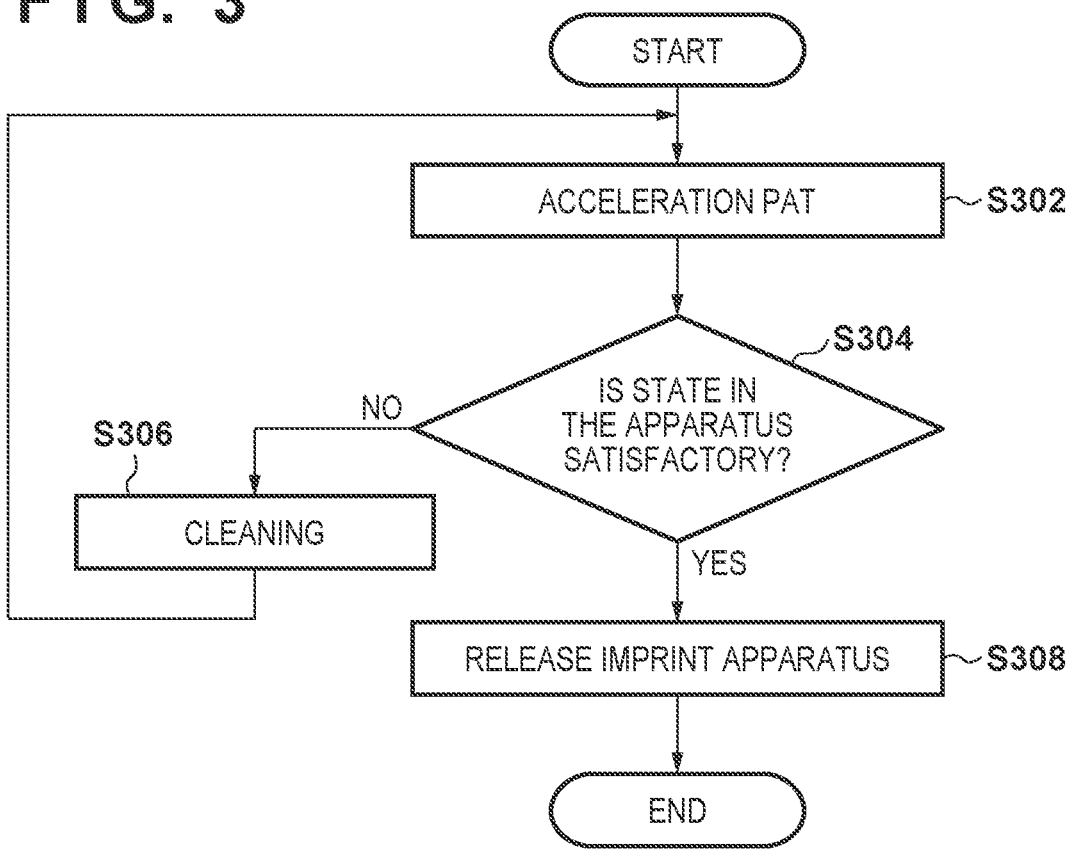

EVALUATION METHOD, SUBSTRATE PROCESSING APPARATUS, MANUFACTURING METHOD OF SUBSTRATE PROCESSING APPARATUS AND ARTICLE MANUFACTURING METHOD

BACKGROUND OF THE INVENTION

Field of the Invention

The present invention relates to an evaluation method, a substrate processing apparatus, a manufacturing method of a substrate processing apparatus and an article manufacturing method.

Description of the Related Art

As the requirements of microfabrication for semiconductor devices, MEMS (Micro Electro Mechanical System), and the like grow, not only conventional photolithography techniques but also imprint techniques have received a great deal of attention. An imprint technique is a microfabrication technique for molding an imprint material on a substrate using a mold and forming a pattern of the imprint material on the substrate. According to the imprint technique, a fine structure on the order of several nanometers can be formed on the substrate.

In the imprint technique, a photo-curing method is used as one of imprint material curing methods. The photo-curing method is a method of curing an imprint material by irradiating it with light such as ultraviolet light in a state in which the imprint material supplied (arranged) on a substrate is in contact with a mold and releasing the mold from the cured imprint material, thereby forming a pattern of the imprint material on the substrate.

Techniques for applying the imprint technique to planarize a substrate in a semiconductor process have also been developed. For example, a surface of a mold, which comes into contact with an imprint material, is formed as a flat surface, and the gap between the substrate and the flat surface of the mold is filled with the imprint material on a substrate, thereby planarizing the substrate.

In an imprint apparatus to which such an imprint technique is applied, to perform pattern formation or planarization, an operation of bringing an mold into direct contact with an imprint material on a substrate and releasing these from each other is necessary. Such an operation greatly affects the life of the mold. For example, one of factors that affect the life of the mold is particles (foreign substances) adhering to the substrate or an original. If pattern formation or planarization is performed in a state in which particles are adhered to the substrate or the original, the pattern (fine structure) of the mold is broken, or the flat surface of the mold becomes uneven. This leads to defects in a semiconductor device manufactured as an article.

In the imprint apparatus, particles are assumed to be generated by apparatus operations, that is, the operations (slide and friction) of stages, conveyance robots, various kinds of actuators, and the like. If the method of supplying an imprint material to a substrate is an inkjet method, when the droplets of the imprint material are discharged, the imprint material may float as mist, dry, solidify, and change to particles. It is also considered that when assembling the imprint apparatus, particles adhered to the surfaces of members and units separate from the surfaces due to a slight state change after the apparatus operation. When conducting maintenance of the imprint apparatus, particles are generated from a maintenance worker (human body), or particles may flow in from the atmosphere in a clean room. These particles float and adhere at points where the airflow stagnates in the imprint apparatus.

In the imprint apparatus, when operating the apparatus, particles existing in the apparatus need to be reduced to a predetermined level (cleanliness) or less. To do this, the imprint apparatus is caused to perform a dummy operation for a long time, thereby guaranteeing that the particles in the apparatus are reduced to a predetermined level or less, for example, to a predetermined number density or less. However, this makes the downtime long and needs a long time until the apparatus becomes operable. Hence, a technique for actively removing (cleaning) particles existing in an apparatus, for example, a technique for loading a charged substrate into an apparatus and causing the substrate to attract particles by an attractive force by an electrostatic force is provided in Japanese Patent Laid-Open No. 2000-260671 or 2015-126092.

In the technique disclosed in Japanese Patent Laid-Open No. 2000-260671, a dust (particle) attraction wafer with an insulating film formed on a surface is charged using a corona discharge type charge unit, the wafer is conveyed in a semiconductor manufacturing apparatus, and dust existing in the apparatus is attracted by the wafer. In the technique disclosed in Japanese Patent Laid-Open No. 2015-126092, a cleaning substrate made of an insulating material is charged using a corona discharge type charge unit before it is conveyed to a substrate processing apparatus, the substrate is conveyed in the apparatus, and dust existing in the apparatus is attracted by the substrate. As described above, Japanese Patent Laid-Open Nos. 2000-260671 and 2015-126092 each disclose a cleaning technique for causing a substrate to attract (suck) particles by the attractive force by the electrostatic force by using a charged substrate in the apparatus.

However, Japanese Patent Laid-Open Nos. 2000-260671 and 2015-126092 do not disclose a concept and method of, after cleaning in the apparatus, confirming (guaranteeing) that particles existing in the apparatus are reduced to a predetermined level or less.

In general, methods of monitoring particles (generation state) existing in the apparatus are roughly classified into two methods. The first method is a method of sucking particles floating in the apparatus and counting using a particle counter. This method can easily monitor the particles existing in the apparatus in real time, but needs to suck a point in the apparatus to count the particles. For this reason, if particles exist (are generate) near the suction point, the particles can be counted, but particles existing in a point apart from the suction point cannot be counted. Hence, the method using the particle counter effectively functions if the point (particle generation point) where particles exist can be predicted. However, if the point where particles exist cannot be predicted, the method does not effectively function.

The second method is a method of loading a bare wafer into the apparatus and counting (the number of) particles adhered to the bare wafer. This method can count particles directly adhered to the bare wafer loaded into the apparatus, and can monitor the particles existing in the apparatus in a state close to the actual apparatus operation. However, in an apparatus in which particles existing in it are maintained almost at a predetermined level, only a few particles exist in the apparatus, and the design is made such that air close the bare wafer maintains a laminar flow. Hence, the possibility that the particles existing in the apparatus adhere to the bare wafer is very low, and, for example, according to the experiments of the present inventor, only about 1% of generated particles adheres to the bare wafer.

Hence, in the conventional techniques, it is very difficult to correctly monitor particles existing in the apparatus.

SUMMARY OF THE INVENTION

The present invention provides a technique advantageous for evaluating a state in an apparatus concerning particles existing inside a substrate processing apparatus in a short time.

According to one aspect of the present invention, there is provided an evaluation method for evaluating a state in an apparatus concerning particles existing inside a substrate processing apparatus for processing a substrate, including arranging a plate in a charged state inside the apparatus and obtaining the number of particles adhered to the plate by performing a dummy operation different from an operation of processing the substrate, and evaluating the state in the apparatus based on a coefficient representing a ratio of the number of particles adhered to the plate by performing the dummy operation for the plate in an uncharged state to the number of particles adhered to the plate in the charged state, and the number of particles obtained in the arranging the plate.

Further aspects of the present invention will become apparent from the following description of exemplary embodiments with reference to the attached drawings.

BRIEF DESCRIPTION OF THE DRAWINGS

FIG. 2 is a flowchart for describing processing of obtaining an acceleration coefficient.

FIG. 3 is a flowchart for describing evaluation processing of evaluating a state in the apparatus concerning particles.

DESCRIPTION OF THE EMBODIMENTS

Figure 1:
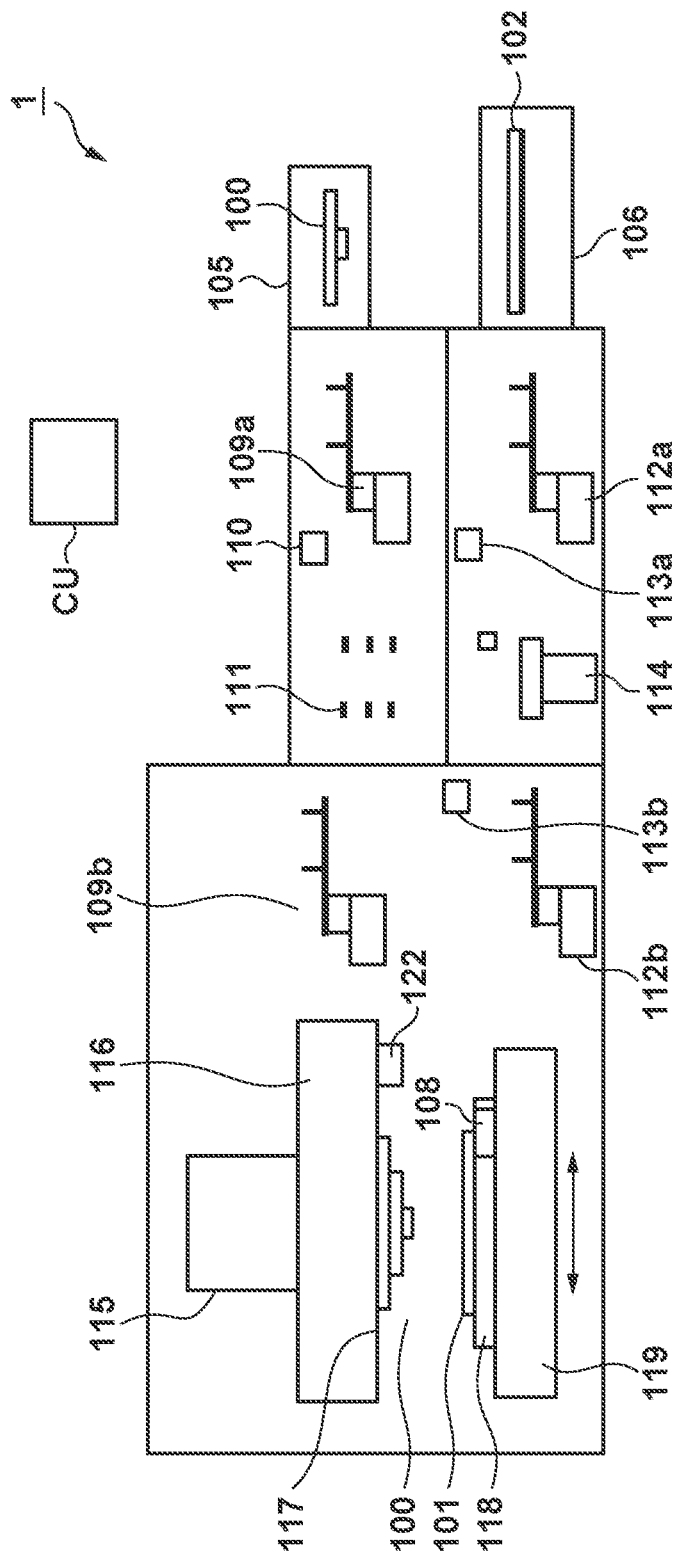
FIG. 1 is a schematic view illustrating configurations of an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a schematic view illustrating configurations of an imprint apparatus 1 according to an aspect of the present invention. The imprint apparatus 1 is a substrate processing apparatus for processing a substrate. The imprint apparatus 1 is embodied as, for example, a lithography apparatus employed in a lithography step that is a manufacturing step for a device such as a semiconductor element, a liquid crystal display element, or a magnetic storage medium as an article to form a pattern on a substrate. The imprint apparatus 1 brings an uncured imprint material supplied (arranged) on a substrate into contact with a mold, and applies curing energy to the imprint material, thereby forming a pattern of a cured product to which the pattern of the mold is transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

The imprint apparatus 1 employs a photo-curing method for curing an imprint material by irradiation of light (ultraviolet light) as the curing method of the imprint material. Note that in the drawings, a direction parallel to the irradiation axis of light to a mold is defined as the Z direction on an XYZ coordinate system, and two directions orthogonal to each other in a plane vertical to the Z-axis are defined as the X direction and the Y direction.

The units of the imprint apparatus 1 will be described with reference to FIG. 1. The imprint apparatus 1 includes an irradiation unit 115, a mold driving unit 116, a mold holding unit 117, a substrate chuck 118, a substrate stage 119, a supply unit 122, an alignment scope (not shown), and a gas supply unit (not shown). The imprint apparatus 1 also includes substrate conveyance robots 112a and 112b configured to convey a substrate 101 or a plate 102 serving as a test substrate stored in a substrate conveyance container 106, ionizers 113a and 113b, and a processing station 114. Furthermore, the imprint apparatus 1 includes mold conveyance robots 109a and 109b configured to convey a mold 100 stored in a mold conveyance container 105, an ionizer 110, a stocker 111, a charge unit 108, and a control unit CU.

The mold 100 has a rectangular outer peripheral shape, and includes, on a surface facing the substrate 101, a pattern region including a three-dimensionally formed pattern (an uneven pattern such as a circuit pattern to be transferred to the substrate 101). The mold 100 is made of a material capable of passing light, for example, quartz.

The mold holding unit 117 includes a mold chuck that attracts and holds the mold 100 by a vacuum suction force or an electrostatic force. The mold driving unit 116 holds and drives the mold holding unit 117, thereby moving the mold 100 held by the mold holding unit 117. The mold driving unit 116 drives the mold holding unit 117 (mold 100) in the Z direction to selectively perform pressing the mold 100 against the imprint material on the substrate (press) and releasing the mold 100 from the imprint material on the substrate (mold release). Actuators applicable to the mold driving unit 116 include, for example, a linear motor and an air cylinder. To accurately position the mold 100, the mold driving unit 116 may be formed by a plurality of driving systems such as a coarse driving system and a fine driving system. In addition, the mold driving unit 116 may be configured to move the mold 100 not only in the Z direction but also in the X direction or the Y direction. Furthermore, the mold driving unit 116 may be configured to have a tilt function of adjusting the position of the mold 100 in the θ (rotation about the Z-axis) direction or the tilt of the mold 100.

In imprint processing, the irradiation unit 115 irradiates an imprint material on a substrate with light, for example, ultraviolet light via the mold 100. The irradiation unit 115 includes a light source, and optical members (a lens, a mirror, a light-shielding plate, and the like) configured to adjust the state (an intensity distribution, an irradiation region, and the like) of light from the light source to a state appropriate for imprint processing. In this embodiment, since the photo-curing method is employed, the imprint apparatus 1 includes the irradiation unit 115. If a thermo-setting method is employed, the imprint apparatus 1 includes a heat source unit configured to set a thermosetting imprint material in place of the irradiation unit 115.

The alignment scope detects an alignment mark provided on the mold 100 and an alignment mark provided on the substrate 101, and measures positional deviations in the X direction and the Y direction between the alignment marks.

The supply unit 122 discharges droplets of the imprint material to the substrate 101 based on a preset drop recipe, thereby supplying (arranging) the imprint material onto the substrate. The supply position and the supply amount, on the substrate, of the droplets of the imprint material discharged from the supply unit 122 are set as a drop recipe in accordance with, for example, the thickness (residual film thickness) of the pattern of the imprint material to be formed on the substrate 101, the density of the pattern of the imprint material, and the like.

The gas supply unit supplies a gas to prevent particles generated inside the imprint apparatus 1 (in the apparatus) from entering to the periphery of the mold 100 and the substrate 101.

The substrate chuck 118 attracts and holds the substrate 101 or the plate 102 by a vacuum suction force or an electrostatic force. The substrate chuck 118 is thus configured to hold the substrate 101 and the plate 102. The substrate chuck 118 is provided with the charge unit 108 capable of applying a voltage to the plate 102 from its back surface and charging the plate 102, as will be described later. The substrate chuck 118 is supported by the substrate stage 119, and driven in the X-Y plane via the substrate stage 119. When bringing the mold 100 into contact with the imprint material on the substrate, the position of the substrate stage 119 is adjusted, thereby making the position of the mold 100 and the position of the substrate 101 match each other (aligning). Actuators applicable to the substrate stage 119 include, for example, a linear motor and an air cylinder. In addition, the substrate stage 119 may be configured to move the substrate 101 not only in the X direction or the Y direction but also in the Z direction.

In this embodiment, the operations of pressing and releasing the mold 100 are implemented by driving the mold holding unit 117 holding the mold 100 in the Z direction, as described above. However, the operations of pressing and releasing the mold 100 may be implemented by driving the substrate chuck 118 holding the substrate 101 in the Z direction or by driving the mold holding unit 117 and the substrate chuck 118 relatively in the Z direction.

The substrate conveyance container 106 is a FOUP (Front Opening Unified Pod) that conveys and manages a substrate such as the substrate 101 or the plate 102 by a mini-environment method. The plate 102 is a substrate capable of charging a surface and capable of adhering particles to the surface, as will be described later. The substrate conveyance container 106 stores a substrate such as the substrate 101 or the plate 102.

The substrate conveyance robots 112a and 112b are robots configured to convey the substrate 101 or the plate 102. The substrate conveyance robot 112a extracts a substrate stored in the substrate conveyance container 106 and conveys the substrate to the processing station 114. The processing station 114 performs rough positioning (prealignment) and temperature adjustment of the substrate conveyed from the substrate conveyance container 106. The substrate conveyance robot 112b extracts the substrate from the processing station 114 and conveys the substrate to the substrate chuck 118.

The substrate conveyed between the substrate conveyance container 106 and the substrate chuck 118 is sucked to various kinds of members and detached from various kinds of members, and is therefore readily charged because of friction to the various kinds of members. Hence, the ionizers 113a and 113b are arranged in the conveyance path between the substrate conveyance container 106 and the substrate chuck 118. Ions generated by the ionizers 113a and 113b are supplied to the conveyance path between the substrate conveyance container 106 and the substrate chuck 118, thereby preventing the substrate from being charged more than necessary.

The mold conveyance container 105 is a SMIF (Standard Mechanical Interface) pod that conveys and stores the mold 100 by a mini-environment method. The mold 100 is stored in the mold conveyance container 105.

The mold conveyance robots 109a and 109b are robots configured to convey the mold 100. The mold conveyance robot 109a extracts the mold 100 stored in the mold conveyance container 105 and conveys the mold 100 to the stocker 111 that temporarily stores the mold and enables mold exchange. The mold conveyance robot 109b extracts the mold 100 from the stocker 111 and conveys the mold 100 to the mold holding unit 117.

The mold 100 conveyed between the mold conveyance container 105 and the mold holding unit 117 is sucked to various kinds of members and detached from various kinds of members, and is therefore readily charged because of friction to the various kinds of members. Hence, the ionizer 110 is arranged in the conveyance path between the mold conveyance container 105 and the mold holding unit 117. Ions generated by the ionizer 110 are supplied to the conveyance path between the mold conveyance container 105 and the mold holding unit 117, thereby preventing the mold 100 from being charged more than necessary.

The control unit CU is formed by, for example, a computer (information processing apparatus) including a CPU and a memory, and generally controls the units of the imprint apparatus 1 in accordance with a program stored in a storage unit or the like. The control unit CU controls the operations and adjustment of the units of the imprint apparatus 1, thereby controlling imprint processing of forming the pattern of the imprint material on the substrate using the mold 100. Also, the control unit CU controls evaluation processing of evaluating (monitoring) the state in the apparatus concerning particles existing inside the imprint apparatus 1, more specifically, cleanliness. The control unit CU may be formed integrally with the remaining portions of the imprint apparatus 1 (in a common housing), or may be formed separately from the remaining portions of the imprint apparatus 1 (in another housing).

In this embodiment, to evaluate the state (cleanliness) in the apparatus concerning particles existing inside the imprint apparatus 1 in a short time, the frequency of adhesion of particles to the plate 102 (to be referred to as a "particle adhesion frequency" hereinafter) is improved. The present inventor defines the particle adhesion frequency as follows.

[particle adhesion frequency]=[dust generation frequency]×[transport efficiency]×[adhesion probability]

Here, "dust generation frequency" means the dust generation frequency of a dust generation portion (particle generation point) in the apparatus. Normally, since it is difficult to specify (grasp) the dust generation portion in the apparatus, it is not realistic to control "dust generation frequency". In addition, "transport efficiency" means the efficiency (ease of transport) of transporting (moving) particles from the dust generation portion in the apparatus to the plate 102. Normally, since "transport efficiency" is determined by the design and structure of the apparatus, it is difficult to control the transport efficiency after assembly of the apparatus. Hence, to improve "particle adhesion frequency", "adhesion probability" needs to be improved.

In this embodiment, to improve "adhesion probability", the plate 102 is charged, thereby accelerating adhesion of particles to the plate 102 using an electrostatic force generated in the plate 102. For example, when repeating an apparatus operation imitating an imprint operation concerning normal imprint processing, that is, a so-called dummy operation different from an operation of processing a substrate, charges are given to the plate 102 to charge the surface. This improves the adhesion probability of particles existing in the apparatus to the plate 102. When the particles adhered to the plate 102 with the charged surface are inspected, for example, the number of particles is counted, the state (cleanliness) in the apparatus concerning particles can be evaluated in a short time.

More specifically, in this embodiment, before the state in the apparatus concerning particles is evaluated, the following three steps are executed to obtain an acceleration coefficient. Here, the acceleration coefficient is a coefficient representing the ratio of the number of particles adhered to the plate 102 in an uncharged state to the number of particles adhered to the plate 102 in a charged state by performing the dummy operation in the apparatus, as will be described later.

Processing (third step) of obtaining an acceleration coefficient will be described with reference to FIG. 2. Note that in this embodiment, this processing is performed by the control unit CU generally controlling the units of the imprint apparatus 1.

In step S102, Particle Adder Test (PAT) is executed. More specifically, the plate 102 stored in the substrate conveyance container 106 is conveyed to the substrate holding unit formed by the substrate chuck 118 and the substrate stage 119 via the substrate conveyance robots 112a and 112b, and the substrate chuck 118 is caused to hold the plate 102. Next, the dummy operation is repeated a predetermined number of times for the plate 102 held by the substrate chuck 118. The dummy operation is an apparatus operation imitating the imprint operation concerning normal imprint processing, as described above. In this embodiment, an apparatus operation in which supply of the imprint material and press and release of the mold 100 are not performed, and the rest of the operation is performed as in normal imprint processing (device manufacturing) is defined as the dummy operation. The number of particles adhered to the plate 102 by performing the dummy operation is counted (inspected), thereby obtaining an adhesion count N0 [number/operation] of particles per operation. Note that to measure the number of particles adhered to the plate 102, an external measuring device (inspection device) capable of measuring the number of particles is used. As described above, in step S102, the plate 102 in the uncharged state is arranged inside the imprint apparatus 1, and the number (first number) of particles adhered to the plate 102 by performing the dummy operation is obtained.

In step S104, acceleration Particle Adder Test (acceleration PAT) is executed. More specifically, first, the plate 102 stored in the substrate conveyance container 106 is conveyed to the substrate holding unit formed by the substrate chuck 118 and the substrate stage 119 via the substrate conveyance robots 112a and 112b, and the substrate chuck 118 is caused to hold the plate 102. Note that the plate 102 used in the acceleration PAT may be the plate 102 used in the Pat (step S102). In this case, however, the particles adhered to the plate 102 by executing PAT need to be removed (cleaned). Next, the plate 102 held by the substrate chuck 118 is charged, and the dummy operation is repeated a predetermined number of times for the plate 102 in the charged state. The number of particles adhered to the plate 102 by performing the dummy operation is measured, thereby obtaining an adhesion count N1 [number/operation] of particles per operation. In the acceleration PAT, the adhesion probability of particles to the plate 102 is improved. Hence, a relationship of adhesion count N1>adhesion count N0 holds. As described above, in step S104, the plate 102 in the charged state is arranged inside the imprint apparatus 1, and the number (second number) of particles adhered to the plate 102 by performing the dummy operation is obtained. Note that to charge the plate 102 held by the substrate chuck 118, for example, the charge unit 108 provided in the substrate chuck 118 is used. Also, in this embodiment, an example in which the plate 102 in the uncharged state, which is held by the substrate chuck 118, is charged has been described. However, the plate 102 in the charged state may be loaded and held by the substrate chuck 118.

In step S106, an acceleration coefficient K is calculated from the adhesion count N0 (first number) obtained in step S102 and the adhesion count N1 (second number) obtained in step S104. More specifically, the acceleration coefficient K is calculated by K=N1/N0. The acceleration coefficient K is an index representing how much adhesion of particles to the plate 102 is accelerated by the acceleration PAT with respect to the PAT. Note that the acceleration coefficient K calculated in step S106 is stored in, for example, a storage unit provided in the imprint apparatus 1.

When the acceleration coefficient K is obtained in this way, even when acceleration PAT is executed when evaluating the state in the apparatus concerning particles, the state in the apparatus concerning particles can be estimated in consideration of the acceleration coefficient K. It is therefore possible to evaluate the state in the apparatus concerning particles in a short time.

Note that the processing of obtaining the acceleration coefficient K is performed when the imprint apparatus 1 is shipped, and the members of the imprint apparatus 1 are assembled in a factory of a user or the like, that is, at the time of so-called assembling of the imprint apparatus 1. If the acceleration coefficient K changes over time, the processing of obtaining the acceleration coefficient K is performed periodically or when performing maintenance of the imprint apparatus 1.

Evaluation processing of evaluating the state in the apparatus concerning particles will be described with reference to FIG. 3. The evaluation processing is performed, for example, after assembling or maintenance of the imprint apparatus 1. This is because when a work of assembling the imprint apparatus 1 or a work of performing maintenance is completed, the state in the apparatus concerning particles existing inside the imprint apparatus 1 needs to be confirmed.

In step S302, acceleration PAT is executed. The acceleration PAT is the same as that in step S104 described with reference to FIG. 2, and a detailed description thereof will be omitted here. When acceleration PAT is executed, an adhesion count M1 [number/operation] of particles per operation is obtained. As described above, in step S302 (first step), the plate 102 in the charged state is arranged inside the imprint apparatus 1, and the number of particles adhered to the plate 102 by performing the dummy operation is obtained.

In step S304, it is determined, based on the acceleration coefficient K and the adhesion count M1 obtained in step S302, whether the state in the apparatus concerning particles is satisfactory. For example, assume that as the specification value of PAT, the adhesion count of particles per operation is defined as M0 [number/operation]. Note that it can be said that M0 is the number of particles adhered to the plate 102 in the uncharged state by performing the dummy operation when the number of particles existing in the apparatus satisfies the specification value. In this case, if M1/K M0 is not satisfied, it is determined (evaluated) that the state in the apparatus concerning particles is not satisfactory (faulty), and the process advances to step S306. On the other hand, if M1/K M0 is satisfied, it is determined that the state in the apparatus concerning particles is satisfactory, and the process advances to step S308. As described above, in step S304 (second step), the state in the apparatus concerning particles is evaluated based on the acceleration coefficient K and the adhesion count M1 obtained in step S302.

In step S306, cleaning in the apparatus is performed (that is, particles existing in the apparatus are removed), and the process returns to step S302. Any technique known in the industry can be applied to cleaning in the apparatus.

In step S308, in response to confirmation (guarantee) of the satisfactory state in the apparatus concerning particles, the imprint apparatus 1 is released. Here, the release of the imprint apparatus 1 includes, for example, notifying the user that the imprint apparatus 1 is operable, and switching the operation mode of the imprint apparatus 1 to the operation mode of device manufacturing.

As described above, in this embodiment, when the acceleration coefficient K is used, acceleration PAT can be executed when evaluating the state in the apparatus concerning particles. Hence, the state in the apparatus concerning particles existing inside the imprint apparatus 1 can be evaluated in a short time. In addition, if a time to sufficiently execute acceleration PAT can be ensured, adhesion of particles to the plate 102 is accelerated, and this can be used for cleaning in the apparatus (removal of particles).

Note that the acceleration coefficient K is preferably obtained for each imprint apparatus. However, if there is little machine difference between a plurality of imprint apparatuses, the acceleration coefficient K obtained from an imprint apparatus can commonly be used in a plurality of imprint apparatuses.

Figure 4:
FIG. 4 is a view illustrating the configuration of a plate.

A detailed configuration for executing acceleration PAT will be described next. FIG. 4 is a view illustrating the configuration of the plate 102 used in acceleration PAT. The plate 102 is configured to charge the surface and adhere particles to the surface. For example, as shown in FIG. 4, the plate 102 is formed by a silicon substrate 102*a*, and an insulating layer 102*b* formed on the silicon substrate 102*a*.

In general, the surface of the plate 102 has cleanliness and smoothness that can be inspected by an inspection device generally used in semiconductor manufacturing. More specifically, the surface of the plate 102 is formed from a bare silicon surface or a metal surface, and a native oxide film with a thickness on the nanometer order is formed on the uppermost surface.

The insulating layer 102*b* is formed on the lower surface of the plate 102. In this embodiment, the insulating layer 102*b* is formed on the lower surface of the plate 102 such that a part of the lower surface of the plate 102, that is, a part of the surface (silicon substrate 102*a*) on the side held by the substrate chuck 118 is exposed. The insulating layer 102*b* is formed by a film whose electrical insulation is sufficiently ensured, for example, a silicon thermal oxide film having a thickness of 1 μm or more, a polyimide resin generally used in a semiconductor material, or an acrylic resin, a polyolefin resin, or a polyamide resin.

Figure 5:
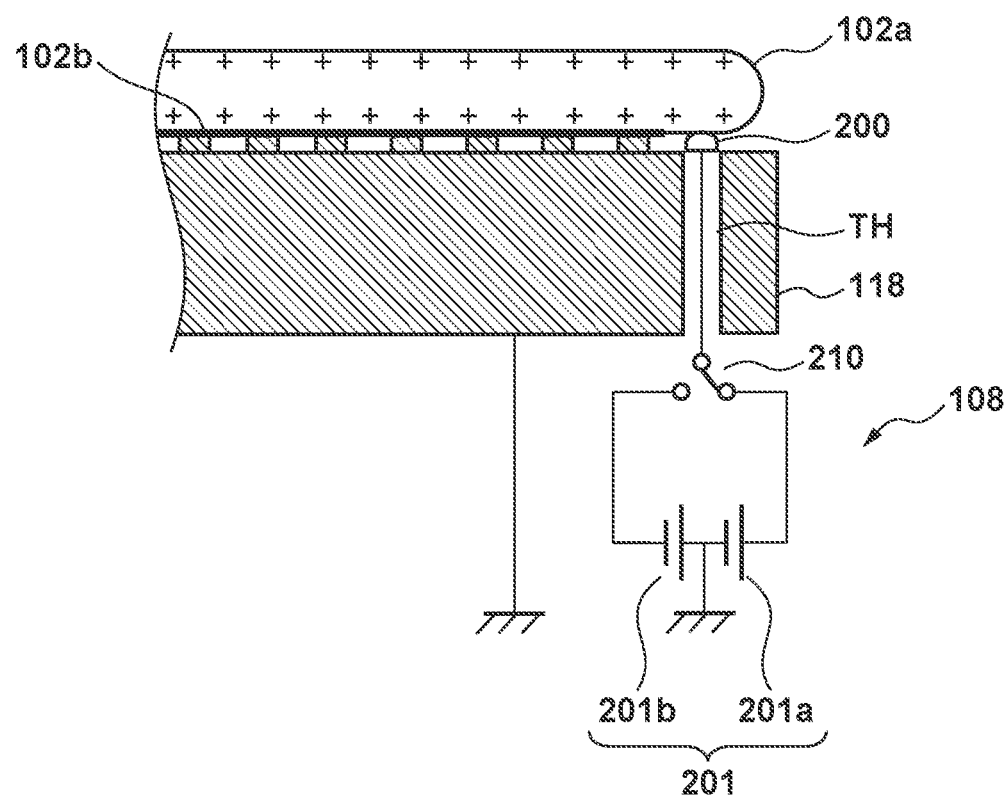
FIG. 5 is a view illustrating the configuration of a charge unit.

FIG. 5 is a view illustrating the configuration of the charge unit 108 that charges the plate 102. In this embodiment, the charge unit 108 is provided in the substrate chuck 118 of the substrate stage 119. As shown in FIG. 5, the substrate chuck 118 is formed by a vacuum chuck, and includes contact portions each having a pin shape to reduce the contact area to the substrate including the substrate 101 and the plate 102.

The charge unit 108 includes a probe 200 that contacts the plate 102, a power supply unit 201 that applies a voltage to the plate 102 via the probe 200, and a switching unit 210 that switches the polarity to charge the plate 102.

The probe 200 is a contact that is inserted into a through hole TH extending through the substrate chuck 118, and comes into direct contact with the lower surface of the plate 102 held by the substrate chuck 118, more specifically, the exposed portion of the lower surface of the plate 102 where the insulating layer 102*b* is not provided. Hence, to ensure conductivity and reduce dust generation as much as possible, the probe 200, for example, has a spherical distal end portion and is made of a metal material that is worn little and hardly oxidized.

The power supply unit 201 is configured to change the polarity to charge the plate 102, and includes, for example, a plurality of types of power supplies. More specifically, the power supply unit 201 includes a power supply 201*a* having a negative electrode grounded and a positive electrode connected to the probe 200 via the switching unit 210, and a power supply 201*b* having a positive electrode grounded and a negative electrode connected to the probe 200 via the switching unit 210.

The switching unit 210 is formed as a switch that switches the power supply to be electrically connected to the probe 200 to the power supply 201a or the power supply 201b to selectively charge the plate 102 to first polarity or second polarity. Note that the first polarity and the second polarity are polarities opposite to each other, in which one is positive, and the other is negative. For example, to positively charge the plate 102, the switching unit 210 connects the power supply 201a to the probe 200. To negatively charge the plate 102, the switching unit 210 connects the power supply 201b to the probe 200. Note that the switching unit 210 also functions as a switch that switches ON/OFF of voltage application to the probe 200.

In this embodiment, when the plate 102 is held (vacuum-sucked) by the substrate chuck 118, the probe 200 automatically comes into contact with the lower surface of the plate 102 to form conduction. At this time, since the probe 200 comes into contact with the exposed portion of the lower surface of the plate 102, where the insulating layer 102b is not provided, as described above, satisfactory conduction is ensured. Note that if the insulating layer 102b is provided on the entire lower surface of the plate 102, the probe 200 may be configured to extend through the insulating layer 102b and come into contact with the lower surface (silicon substrate 102a) of the plate 102 to enable electrical conduction. Alternatively, the metal layer provided on the surface of the plate 102 may be wrapped around to the lower surface, thereby facilitating electrical conduction. Also, the probe 200 may come into contact with the side surface of the plate 102.

Figure 6:
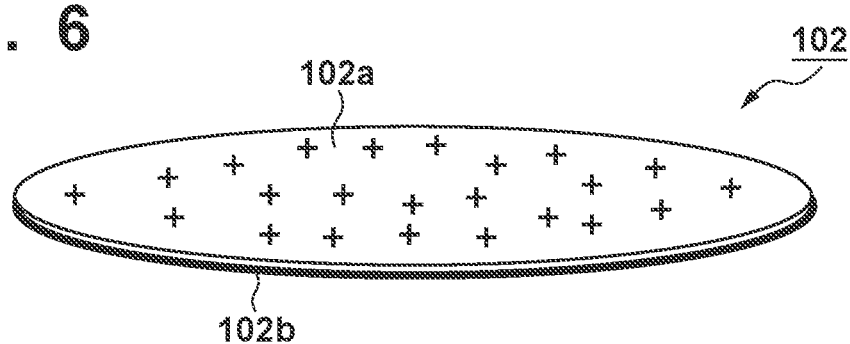
FIG. 6 is a view illustrating a state in which the plate is positively charged.

The charge unit 108 configured in this way brings the probe 200 into contact with the lower surface of the plate 102, applies a voltage from the power supply unit 201 (the power supply 201a or the power supply 201b) to the plate 102 via the probe 200, and supplies charges to the plate 102. When a predetermined number of charges are accumulated in the plate 102, the probe 200 is separated from the plate 102 in a state in which the probe 200 and the power supply unit 201 are connected. This can charge the plate 102 and maintain the charged state of the plate 102. FIG. 6 is a view illustrating a state in which the plate 102 held by the substrate chuck 118 is positively charged. Since the plate 102 has conductivity, the charges supplied to the plate 102 are evenly distributed. In addition, since the plate 102 and the substrate chuck 118 are in contact via the insulating layer 102b, no current flows even if a voltage is applied to the plate 102.

In this embodiment, an example in which the charge unit 108 is provided in the substrate chuck 118 formed by a vacuum chuck has been described. However, the substrate chuck 118 may be formed by an electrostatic chuck. In this case, the plate 102 can be charged by controlling a voltage applied to an electrode inside the electrostatic chuck. In other words, if the substrate chuck 118 is an electrostatic chuck, a voltage application unit that applies a voltage to the electrode inside the electrostatic chuck may be used as the charge unit 108 that charges the plate 102. As described above, independently of the type of the substrate chuck 118, it is necessary to only charge the plate 102 by a substrate holding unit formed from the substrate chuck 118 and the substrate stage 119.

As described above, the imprint apparatus 1 is provided with the ionizers 113a and 113b. Hence, if the ionizers 113a and 113b operate, ions generated by the ionizers 113a and 113b flow toward the substrate chuck 118, to destaticize the plate 102 charged by the charge unit 108. Hence, when executing acceleration PAT, the operation of the ionizers 113a and 113b needs to be stopped. Accordingly, during execution of acceleration PAT, the plate 102 can always maintain a predetermined charged state when a voltage is applied from the charge unit 108.

Figure 7:
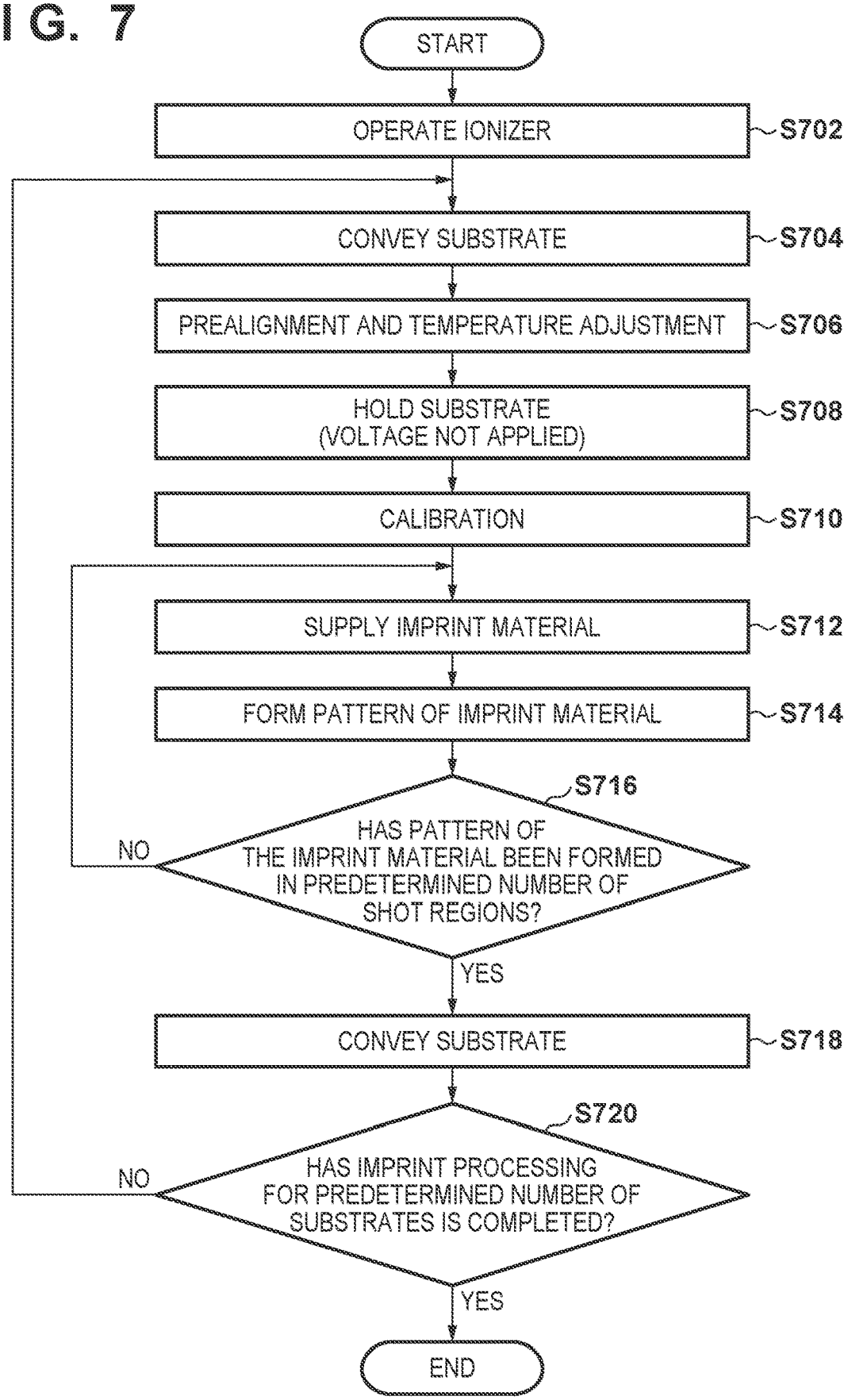
FIG. 7 is a flowchart for describing an imprint operation.
Figure 8:
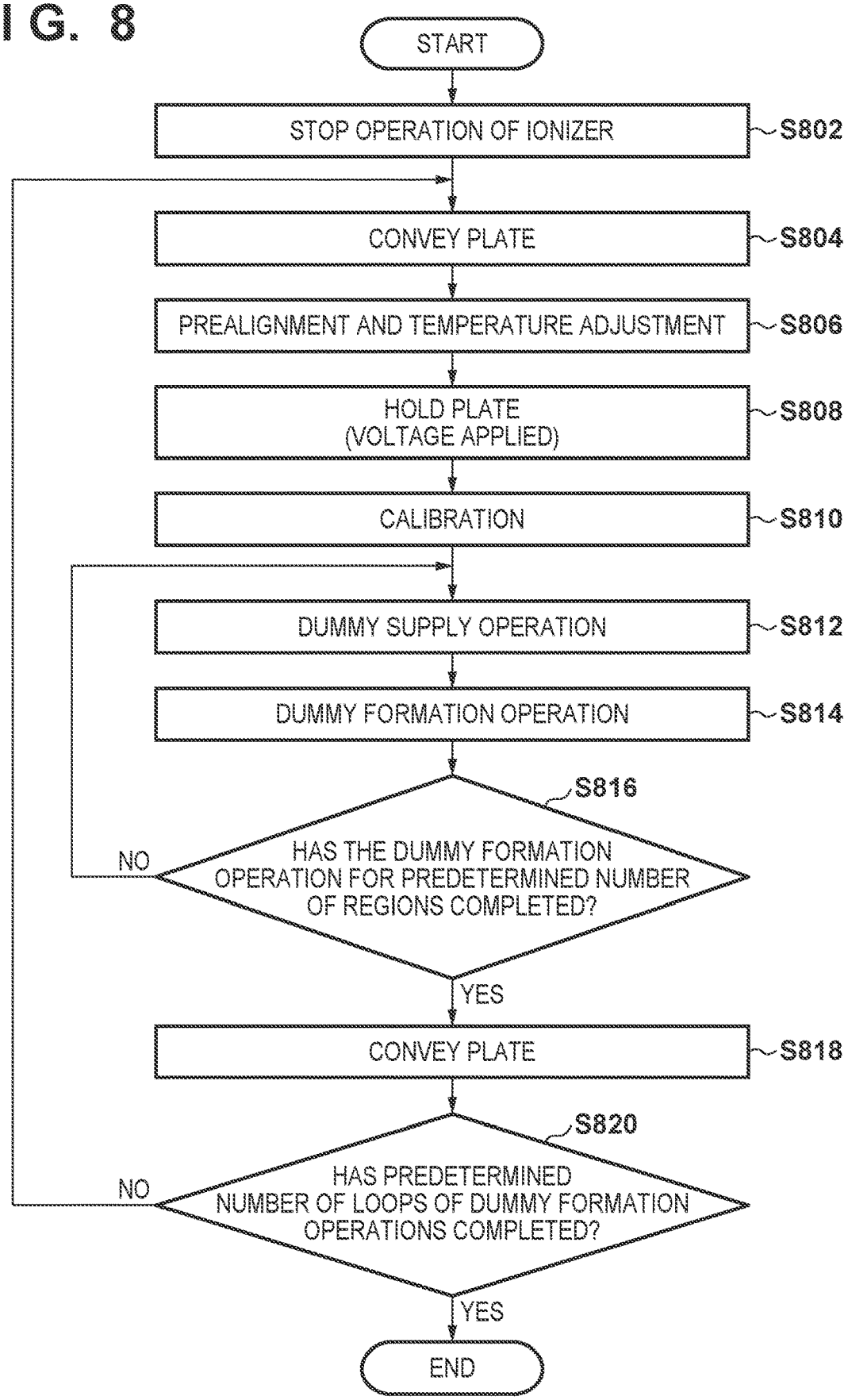
FIG. 8 is a flowchart for describing an acceleration PAT operation.

The difference between an imprint operation concerning normal imprint processing in device manufacturing and an acceleration PAT operation concerning acceleration PAT for evaluating the state in the apparatus concerning particles will be described with reference to FIGS. 7 and 8. FIG. 7 is a flowchart for describing the imprint operation, and FIG. 8 is a flowchart for describing the acceleration PAT operation.

The imprint operation shown in FIG. 7 will be described. In step S702, the ionizers 113a and 113b arranged in the conveyance path between the substrate conveyance container 106 and the substrate chuck 118 are operated. This makes it possible to remove charge of the substrate 101 conveyed from the substrate conveyance container 106 to the substrate chuck 118.

In step S704, the substrate 101 as the target of imprint processing is conveyed (loaded) from the substrate conveyance container 106 to the processing station 114 via the substrate conveyance robot 112a.

In step S706, prealignment and temperature adjustment are performed for the substrate 101 conveyed to the processing station 114. For example, a notch provided in the substrate 101 is detected to position the substrate 101 at low accuracy, and the temperature of the substrate 101 is adjusted to the temperature in the apparatus.

In step S708, the substrate 101 that has undergone prealignment and temperature adjustment is conveyed from the processing station 114 to the substrate chuck 118 via the substrate conveyance robot 112b, and the substrate 101 is held by the substrate chuck 118. At this time, normal imprint processing is performed for the substrate 101 held by the substrate chuck 118. Hence, the charge unit 108 provided in the substrate chuck 118 only brings the probe 200 into contact with the lower surface of the substrate 101. No voltage is applied to the substrate 101, and the substrate 101 has a ground potential (0 V).

In step S710, various kinds of calibrations are performed. The various kinds of calibrations include, for example, various kinds of premeasurements in addition to calibration of the substrate stage 119, calibration of the mold driving unit 116, and the like.

In step S712, an imprint material is supplied to the target shot region on the substrate. More specifically, the substrate stage 119 is driven such that the target shot region of the substrate 101 held by the substrate chuck 118 is located under the supply unit 122, and droplets of the imprint material are discharged from the supply unit 122 to the substrate 101. Hence, the imprint material is supplied to the target shot region on the substrate.

In step S714, a pattern of the imprint material is formed in the target shot region on the substrate. More specifically, the substrate stage 119 is driven such that the target shot region on the substrate to which the imprint material is supplied is located under the mold 100, and the mold 100 and the imprint material on the substrate are brought into contact via the mold driving unit 116. Next, in the state in which the mold 100 and the imprint material on the substrate are in contact, the irradiation unit 115 emits light to cure the imprint material. Then, the mold 100 is released from the cured imprint material on the substrate via the mold driving unit 116. Accordingly, the pattern of the imprint material is formed in the target shot region on the substrate.

In step S716, it is determined whether the pattern of the imprint material is formed in a predetermined number of shot regions. If the pattern of the imprint material is not formed in the predetermined number of shot regions, a shot region where the pattern of the imprint material is not formed is set to the target shot region, and the process returns to step S712. On the other hand, if the pattern of the imprint material is formed in the predetermined number of shot regions, the process advances to step S718.

In step S718, the substrate 101 on which the pattern of the imprint material is formed is conveyed (unloaded) from the substrate chuck 118 to the substrate conveyance container 106 via the substrate conveyance robots 112a and 112b.

In step S720, it is determined whether imprint processing for a predetermined number of substrates is completed. If imprint processing for the predetermined number of substrates is not completed, the process returns to step S704 to perform imprint processing for a new substrate. On the other hand, if imprint processing for the predetermined number of substrates is completed, the imprint operation is ended.

The acceleration PAT operation shown in FIG. 8 will be described. In step S802, the operation of the ionizers 113a and 113b arranged in the conveyance path between the substrate conveyance container 106 and the substrate chuck 118 is stopped. This is to cause the charge unit 108 provided in the substrate chuck 118 to charge the plate 102 held by the substrate chuck 118.

In step S804, the plate 102 is conveyed (loaded) from the substrate conveyance container 106 to the processing station 114 via the substrate conveyance robot 112a.

In step S806, prealignment and temperature adjustment are performed for the plate 102 conveyed to the processing station 114. For example, a notch provided in the plate 102 is detected to position the plate 102 at low accuracy, and the temperature of the plate 102 is adjusted to the temperature in the apparatus.

In step S808, the plate 102 that has undergone prealignment and temperature adjustment is conveyed from the processing station 114 to the substrate chuck 118 via the substrate conveyance robot 112b, and the plate 102 is held by the substrate chuck 118. At this time, the charge unit 108 provided in the substrate chuck 118 brings the probe 200 into contact with the lower surface of the plate 102 held by the substrate chuck 118, and applies a voltage from the power supply unit 201 to the plate 102 via the probe 200. Hence, the plate 102 is evenly charged and maintains a predetermined potential.

In step S810, various kinds of calibrations are performed. The various kinds of calibrations include, for example, various kinds of premeasurements in addition to calibration of the substrate stage 119, calibration of the mold driving unit 116, and the like.

In step S812, a dummy supply operation imitating the operation of supplying the imprint material to the target shot region on the substrate is performed. More specifically, the substrate stage 119 is driven such that the target region of the plate 102 held by the substrate chuck 118 is located under the supply unit 122. However, the supply unit 122 does not discharge droplets of the imprint material to the plate 102, and the imprint material is not supplied to the target region on the plate 102. Note that the target region on the plate 102 corresponds to the target shot region on the substrate.

In step S814, a dummy formation operation imitating the operation of forming the pattern of the imprint material in the target shot region on the substrate is performed. More specifically, the substrate stage 119 is driven such that the target region on the plate is located under the mold 100, and the mold 100 and the plate 102 are made close via the mold driving unit 116 to such an extent that the mold 100 and the plate 102 do not come into contact. Then, the mold 100 and the plate 102 are made far apart via the mold driving unit 116.

In step S816, it is determined whether the dummy formation operation for a predetermined number of regions is completed. If the dummy formation operation for the predetermined number of regions is not completed, the process returns to step S812. If the dummy formation operation for the predetermined number of regions is completed, the process advances to step S818.

In step S818, the plate 102 held by the substrate chuck 118 is conveyed (unloaded) from the substrate chuck 118 to the substrate conveyance container 106 via the substrate conveyance robots 112a and 112b.

In step S820, it is determined whether a predetermined number of loops of dummy formation operations are completed for the plate 102. If the predetermined number of loops of dummy formation operations are not completed, the process returns to step S804. On the other hand, if the predetermined number of loops of dummy formation operations are completed, the acceleration PAT operation is ended.

Note that the plate 102 that has undergone the acceleration PAT operation (that is, the plate 102 conveyed to the substrate conveyance container 106 in step S818) is conveyed to an external measuring device (inspection device). The external measuring device measures the number of particles adhered to the plate 102, and the adhesion count N1 [number/operation] of particles per operation is obtained.

The PAT operation concerning PAT is the same as the acceleration PAT operation except that the plate 102 is not charged, and the potential is maintained at 0 V in step S808. In addition, the plate 102 that has undergone the PAT operation is conveyed to the external measuring device (inspection device). The external measuring device measures the number of particles adhered to the plate 102, and the adhesion count N0 [number/operation] of particles per operation is obtained.

As described above, in this embodiment, the acceleration coefficient K is obtained from the adhesion count N0 obtained from PAT, and the adhesion count N1 obtained from acceleration PAT. When the acceleration coefficient K is obtained, acceleration PAT is executed when evaluating the state in the apparatus concerning particles, and the state in the apparatus concerning particles (the number of particles existing in the apparatus) is estimated in consideration of the acceleration coefficient K. It is therefore possible to evaluate the state in the apparatus concerning particles in a short time, more specifically, in a time 1/K as compared to a case in which PAT is executed.

Also, in this embodiment, the substrate 101 and the plate 102 have been described as different substrates. However, if an insulating layer is provided on the substrate 101, the substrate 101 may be used as the plate 102.

Second Embodiment

In the first embodiment, a case in which the charge unit 108 is provided in the substrate chuck 118 and the substrate stage 119 (substrate holding unit) to charge the plate 102 held by the substrate chuck 118 has been described. In the second embodiment, a case in which a plate 102 is charged in the conveyance path between a substrate conveyance container 106 and a substrate chuck 118 will be described.

Figure 9:
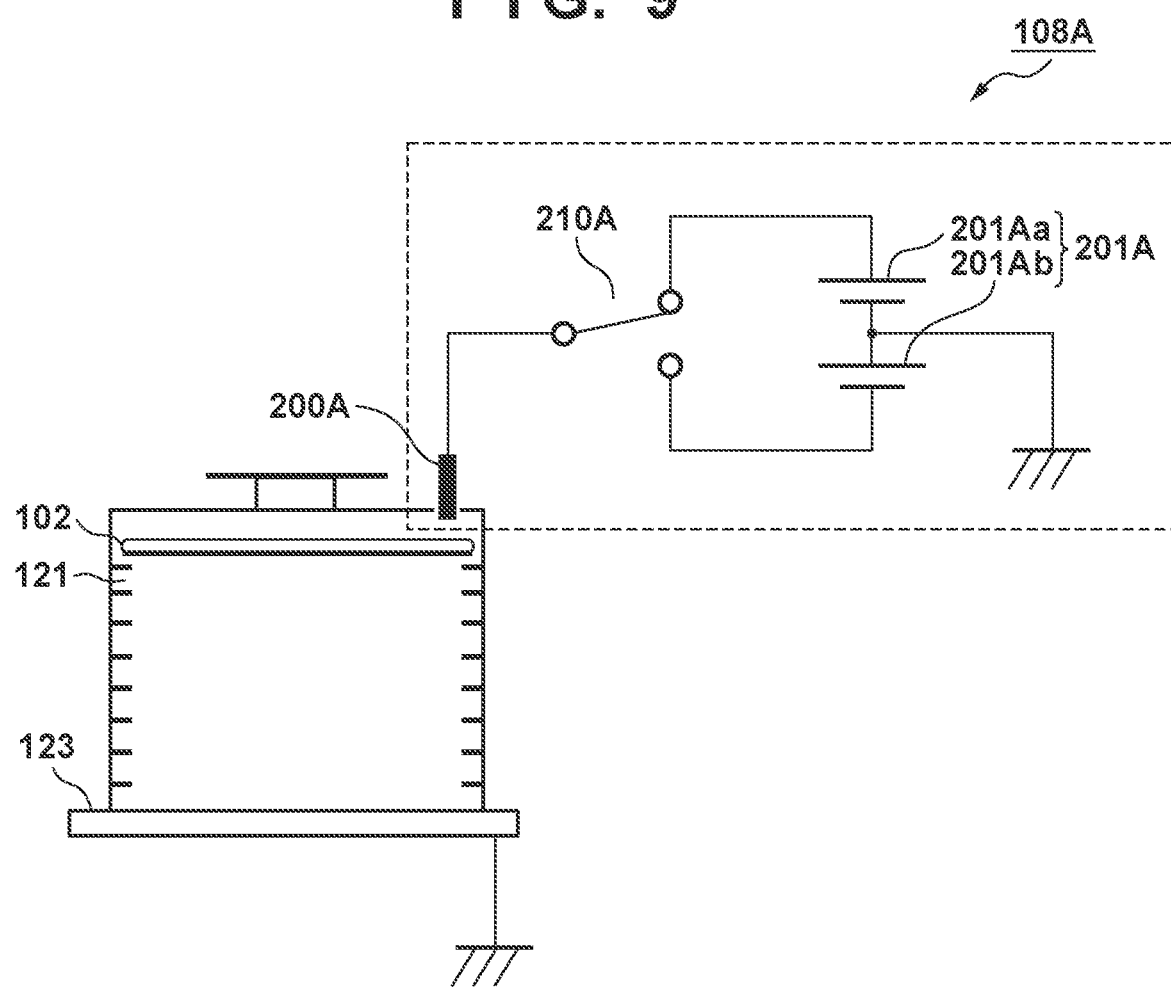
FIG. 9 is a schematic view illustrating the configuration of a substrate conveyance container.

In this embodiment, a charge unit 108A is provided in the substrate conveyance container 106, as shown in FIG. 9, and charges the plate 102 inside the substrate conveyance container 106. As described above, the substrate conveyance container 106 is formed by a FOUP used to convey and manage a substrate in standard, and the charge unit 108A can be provided by adding a simple alteration to the FOUP. FIG. 9 is a schematic view illustrating the configuration of the substrate conveyance container 106.

When the FOUP is used, advantages to be described below can be obtained. The FOUP can be mounted on the load port of an EFEM (Equipment Front End Module) of an imprint apparatus 1. Also, in a state in which the plate 102 to which particles are adhered is stored in the FOUP, the FOUP can be conveyed from the imprint apparatus 1 to an external inspection device to inspect the particles adhered to the plate 102. Furthermore, since the plate 102 is charged outside the main body portion (a processing unit that performs imprint processing) of the imprint apparatus 1, it is necessary to only add a simple alteration to the FOUP, as described above, and the main body portion of the imprint apparatus 1 need not be altered.

The charge unit 108A provided in the substrate conveyance container 106 includes a probe 200A that contacts the plate 102, a power supply unit 201A that applies a voltage to the plate 102 via the probe 200A, and a switching unit 210A that switches the polarity to charge the plate 102.

In this embodiment, the probe 200A is a contact that comes into direct contact with the surface of the plate 102. To ensure conductivity and reduce dust generation as much as possible, the probe 200A, for example, has a spherical distal end portion and is made of a metal material that is worn little and hardly oxidized. Note that to prevent dust generation caused by bringing the probe 200A into contact with the plate 102 from being wrapped around to the surface, the probe 200A may be brought into contact with not the surface of the plate 102 but the side surface of the plate 102.

The power supply unit 201A is configured to change the polarity to charge the plate 102, and includes, for example, a plurality of types of power supplies. More specifically, the power supply unit 201A includes a power supply 201Aa having a negative electrode grounded and a positive electrode connected to the probe 200A via the switching unit 210A, and a power supply 201Ab having a positive electrode grounded and a negative electrode connected to the probe 200A via the switching unit 210A.

The switching unit 210A is formed as a switch that switches the power supply to be electrically connected to the probe 200A to the power supply 201Aa or the power supply 201Ab to selectively charge the plate 102 to first polarity or second polarity. Note that the first polarity and the second polarity are polarities opposite to each other, in which one is positive, and the other is negative. For example, to positively charge the plate 102, the switching unit 210A connects the power supply 201Aa to the probe 200A. To negatively charge the plate 102, the switching unit 210A connects the power supply 201Ab to the probe 200A. Note that the switching unit 210A also functions as a switch that switches ON/OFF of voltage application to the probe 200A.

The charge unit 108A configured in this way brings the probe 200A into contact with the plate 102, applies a voltage from the power supply unit 201A (the power supply 201Aa or the power supply 201Ab) to the plate 102 via the probe 200A, and supplies charges to the plate 102. When a predetermined number of charges are accumulated in the plate 102, the probe 200A is separated from the plate 102 in a state in which the probe 200A and the power supply unit 201A are connected. This can charge the plate 102 and maintain the charged state of the plate 102. Since the plate 102 has conductivity, the charge distribution on the plate 102 can be even. In addition, it is easy to control the surface potential of the plate 102, and reproducibility can also be ensured.

Inside the substrate conveyance container 106 (FOUP), it is necessary to prevent the charges accumulated in the plate 102 from escaping from a member in contact with the plate 102. For example, the substrate conveyance container 106 is provided with a grooved plate component 121 (Teeth) on which the plate 102 or the substrate 101 is placed. The grooved plate component 121 is a member that comes into contact with the plate 102 and is therefore made of an insulating material. As described above, in the substrate conveyance container 106, the member that comes into contact with the plate 102 is made of an insulating material. On the other hand, a member that does not come into contact with the plate 102, for example, a container main body 123 is made of a material having conductivity, and set to the same potential as ground.

In this embodiment, when executing acceleration PAT, the plate 102 need not be charged on the substrate chuck 118 (by the charge unit 108A). Hence, in step S808 shown in FIG. 8, holding the plate 102 by the substrate chuck 118 suffices, and no voltage need be applied to the plate 102. Note that the rest of the operation is the same as the acceleration PAT operation shown in FIG. 8. Also, when executing PAT, the plate 102 need not be charged in the substrate conveyance container 106 (by the charge unit 108A).

In this embodiment, an example in which the plate 102 is charged in (inside) the substrate conveyance container 106 that is one of the conveyance paths between the substrate conveyance container 106 and the substrate chuck 118 has been described. However, the point at which the plate 102 is charged is not limited to the substrate conveyance container 106, and an arbitrary point of the conveyance path between the substrate conveyance container 106 and the substrate chuck 118 can be set. For example, the plate 102 may be charged in a processing station 114 where prealignment and temperature adjustment are performed. In this case, the charge unit 108A is provided in the processing station 114 to charge the plate 102, as in the first embodiment.

Third Embodiment

In the second embodiment, a case in which the charge unit 108A is provided in the substrate conveyance container 106 (FOUP) to charge the plate 102 has been described. Note that since the lower surface of the plate 102 is insulated, when conveying the plate 102 in the charged state to the substrate chuck 118 and the substrate stage 119 (substrate holding unit), the charges accumulated in the plate 102 never escape. However, the charged voltage of the plate 102 may vary depending on the conveyance path of the plate 102. In this embodiment, a method for suppressing a variation in the charged voltage of a plate 102 will be described.

When a predetermined voltage is applied to the plate 102 in a substrate conveyance container 106, the charged voltage of the plate 102 is determined depending on the capacitance of a capacitor formed between the plate 102 and a container main body 123 connected to ground. In general, an electrostatic capacitance C of a parallel plate capacitor is defined by $C = \varepsilon S/d$, where $\varepsilon$ is the dielectric constant, S is the surface area, and d is the gap distance of the parallel plate. Hence, the electrostatic capacitance C of the parallel plate capacitor is reversely proportional to the gap distance of the parallel plate. On the other hand, letting V be the charged voltage, charges Q accumulated in the parallel plate can be expressed as $Q = CV$. Hence, the charged voltage V depends on the electrostatic capacitance C. Considering these, the charged voltage of the plate 102 may vary due to the difference in the electrostatic capacitance between points of the conveyance path in the apparatus.

Figure 10:
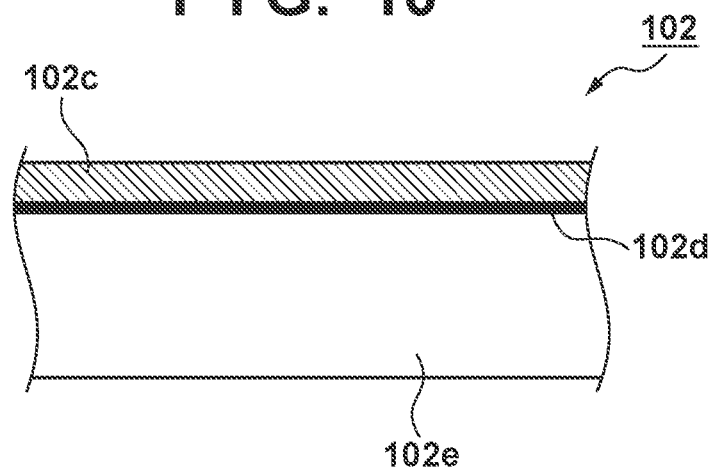
FIG. 10 is a view illustrating a cross section of a plate.

In this embodiment, to suppress the variation of the charged voltage of the plate 102, a capacitor structure is provided for the plate 102. More specifically, as shown in FIG. 10, an $SiO_2$ insulating layer 102d and a silicon layer 102c are sequentially formed on the surface of a silicon substrate 102e. FIG. 10 is a view illustrating a cross section of the plate 102 having the capacitor structure. The configuration shown in FIG. 10 is generally called a SOI (Silicon on Insulator) wafer. In this embodiment, a capacitor structure is provided on the plate 102, like the SOI wafer, and charges are stored in the capacitor structure. In this case, since the electrostatic capacitance of the capacitor structure provided on the plate 102 does not vary, even if the plate 102 is conveyed in the apparatus, the variation of the charged voltage of the plate 102 can be suppressed. Note that since the main gist of this embodiment is to provide a capacitor structure on the plate 102, for example, the silicon layer 102c may be replaced with a metal layer.

In this embodiment, when executing acceleration PAT, in step S808 shown in FIG. 8, the plate 102 need not be charged by a charge unit 108A provided in a substrate chuck 118, and holding the plate 102 by the substrate chuck 118 suffices, as in the second embodiment. Note that the rest of the operation is the same as the acceleration PAT operation shown in FIG. 8. Also, when executing PAT, the plate 102 need not be charged in the substrate conveyance container 106 (by the charge unit 108A).

Fourth Embodiment

The pattern of a cured product formed using the imprint apparatus 1 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 11A:
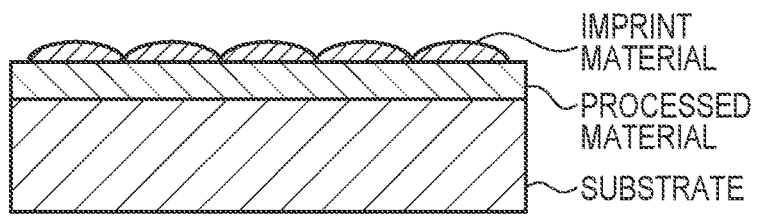
FIG. 11A to FIG. 11F are views for describing an article manufacturing method.

Next, description regarding a detailed method of manufacturing an article is given. As illustrated in FIG. 11A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 11B:
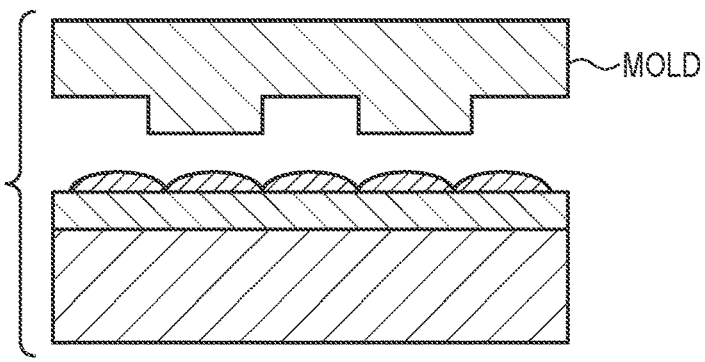
Figure 11C:
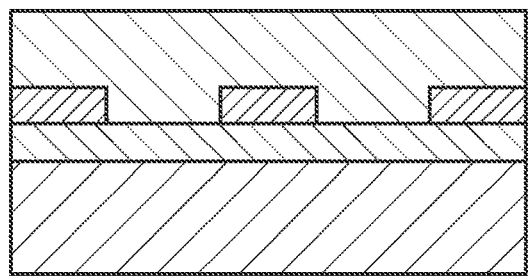

As shown in FIG. 11B, a side of the mold for imprint with a projection and groove pattern is formed on and caused to face the imprint material on the substrate. As illustrated in FIG. 11C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 11D:
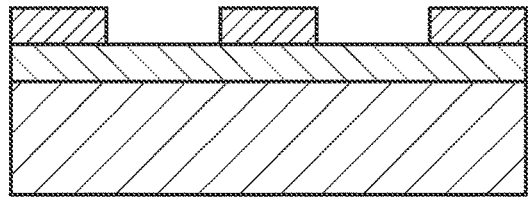

As shown in FIG. 11D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold 4z is transferred to the imprint material.

Figure 11E:
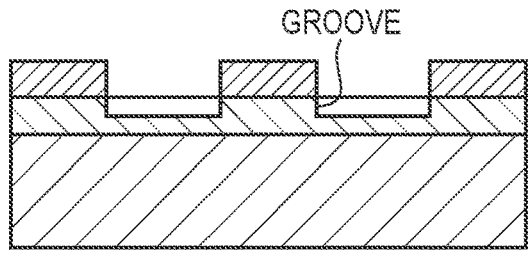
Figure 11F:
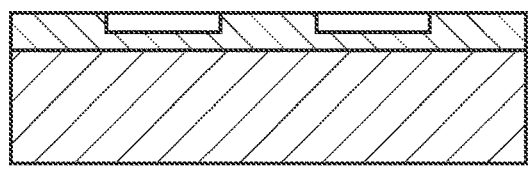

As shown in FIG. 11E, when etching is performed using the pattern of the cured product as an etching resistant mask, a portion of the surface of the processed material where the cured product does not exist or remains thin is removed to form a groove. As shown in FIG. 11F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

A manufacturing method of the imprint apparatus 1 including evaluation processing shown in FIG. 3 also forms one aspect of the present invention. The manufacturing method includes a step of assembling members of the imprint apparatus 1, and a step of evaluating, using evaluation processing shown in FIG. 3, the state in the apparatus concerning particles existing inside the imprint apparatus 1 formed by assembling the members. Also, an article manufacturing method including a step of manufacturing the imprint apparatus 1 using the manufacturing method, and a step of performing the operation shown in FIGS. 11A to 11F using the imprint apparatus 1 also forms one aspect of the present invention.

In the above embodiment, as a substrate processing apparatus for processing a substrate, an imprint apparatus that forms a pattern on a substrate by molding, using a mold, an imprint material on the substrate has been described as an example. However, the present invention is not limited to this. For example, the substrate processing apparatus includes a planarization apparatus that planarizes a composition on a substrate using a mold with a flat surface and a lithography apparatus that forms a pattern on a substrate. As the lithography apparatus, there exists an exposure apparatus that transfers the pattern of an original to a substrate by exposing the substrate via the original, or a drawing apparatus that draws a pattern on a substrate using a charged particle beam (an electron beam or an ion beam). The substrate processing apparatus also includes apparatuses used in steps other than the lithography step, such as an application apparatus that applies a photosensitive medium onto a substrate, and a developing apparatus that develops a substrate on which a latent image pattern is formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-081199 filed on May 12, 2021 which is hereby incorporated by reference herein in its entirety.

What is claimed is:

1. An evaluation method for evaluating a state in an apparatus concerning particles existing inside a substrate processing apparatus for processing a substrate, comprising:

arranging a plate in a charged state inside the apparatus and obtaining the number of particles adhered to the plate by performing a dummy operation different from an operation of processing the substrate; and evaluating the state in the apparatus based on a coefficient representing a ratio of the number of particles adhered to the plate by performing the dummy operation for the plate in an uncharged state to the number of particles adhered to the plate in the charged state, and the number of particles obtained in the arranging the plate.

2. The method according to claim 1, wherein in the evaluating the state, the number of particles existing inside is estimated based on the coefficient and the number of particles obtained in the arranging the plate, thereby evaluating the state in the apparatus.

3. The method according to claim 1, wherein letting K be the coefficient, M1 be the number of particles obtained in the arranging the plate, and M0 be the number of particles adhered to the plate in the uncharged state by performing the dummy operation when the number of particles existing inside satisfies a specification value, in the evaluating the state, if M1/K≤M0 is satisfied, it is evaluated that the state in the apparatus is satisfactory.

4. The method according to claim 1, further comprising, before the arranging the plate, obtaining the coefficient,
wherein in the obtaining the coefficient,
the plate in the uncharged state is arranged inside, and a first number representing the number of particles adhered to the plate by performing the dummy operation is obtained,
the plate in the charged state is arranged inside, and a second number representing the number of particles adhered to the plate by performing the dummy operation is obtained, and
the coefficient is calculated from the first number and the second number.

5. The method according to claim 4, wherein the obtaining the coefficient is performed when assembling the substrate processing apparatus or when performing maintenance of the substrate processing apparatus.

6. The method according to claim 1, wherein in the arranging the plate, the plate in the uncharged state is loaded inside, and the plate is charged inside.

7. The method according to claim 1, wherein in the arranging the plate, the plate in the charged state is loaded inside.

8. The method according to claim 1, wherein the state in the apparatus includes cleanliness in the apparatus.

9. An article manufacturing method comprising:
processing a substrate using a substrate processing apparatus evaluated by an evaluation method defined in claim 1;
working the processed substrate; and
manufacturing an article from the worked substrate.

10. A substrate processing apparatus for processing a substrate, comprising:
a holding unit configured to hold the substrate; and
a charge unit provided in the holding unit,
wherein the holding unit is configured to hold a plate used to adhere particles existing inside the substrate processing apparatus, and
the charge unit
includes a contact that is inserted into a through hole extending through the holding unit and comes into contact with the plate held by the holding unit, and
charges the plate by applying a voltage to the contact in contact with the plate and separating the contact from the plate in a state in which the voltage is applied to the contact.

11. The apparatus according to claim 10, wherein
the plate includes, on a surface on a side held by the holding unit, an insulating layer provided such that a part of the surface is exposed, and
the contact comes into contact with the part of the surface where the insulating layer is not provided.

12. An article manufacturing method comprising:
forming a pattern on a substrate using a substrate processing apparatus defined in claim 10;
processing the substrate on which the pattern is formed in the forming; and
manufacturing an article from the processed substrate.

13. A manufacturing method of a substrate processing apparatus for processing a substrate, comprising:
assembling members constituting the substrate processing apparatus; and
evaluating a state in the apparatus concerning particles existing inside the substrate processing apparatus constituted by assembling the members,
wherein the evaluating the state in the apparatus includes:
arranging a plate in a charged state inside the apparatus and obtaining the number of particles adhered to the plate by performing a dummy operation different from an operation of processing the substrate; and
evaluating the state in the apparatus based on a coefficient representing a ratio of the number of particles adhered to the plate by performing the dummy operation for the plate in an uncharged state to the number of particles adhered to the plate in the charged state, and the number of particles obtained in the arranging the plate.

14. An article manufacturing method comprising:
manufacturing a substrate processing apparatus for processing a substrate using a manufacturing method defined claim 13;
forming a pattern on a substrate using the substrate processing apparatus;
processing the substrate on which the pattern is formed in the forming; and
manufacturing an article from the processed substrate.

* * * * *